(12) United States Patent
Tobashi et al.

(10) Patent No.: US 10,573,531 B2
(45) Date of Patent: Feb. 25, 2020

(54) METHOD OF MANUFACTURING SEMICONDUCTOR DEVICE

(71) Applicant: CANON KABUSHIKI KAISHA, Tokyo (JP)

(72) Inventors: Shuji Tobashi, Hiratsuka (JP); Masayuki Tsuchiya, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/059,331

(22) Filed: Aug. 9, 2018

(65) Prior Publication Data

US 2019/0057939 A1 Feb. 21, 2019

(30) Foreign Application Priority Data

Aug. 17, 2017 (JP) .................................. 2017-157583

(51) Int. Cl.
*H01L 21/00* (2006.01)
*H01L 21/3213* (2006.01)
(Continued)

(52) U.S. Cl.
CPC .......... *H01L 21/32139* (2013.01); *G03F 1/42* (2013.01); *G03F 7/70633* (2013.01);
(Continued)

(58) Field of Classification Search
CPC ............... H01L 23/544; H01L 21/3086; H01L 21/0273; H01L 2223/54426; H01L 2223/54453; H01L 21/0337; H01L 21/31144; H01L 21/32139; G03F 7/2022; G03F 9/00; G03F 9/7084; G03F 7/70633; G03F 9/7003; G03F 1/42
See application file for complete search history.

(56) References Cited

U.S. PATENT DOCUMENTS 8,361,876 B2 * 1/2013 Ishimaru ................. G03F 9/708
257/797
10,101,661 B2 * 10/2018 Guo ........................ G03F 9/708
(Continued)

FOREIGN PATENT DOCUMENTS

| JP | 2001-93818 A | 4/2001 |
| JP | 2005-183600 A | 7/2005 |

(Continued)

*Primary Examiner* — Shouxiang Hu
(74) *Attorney, Agent, or Firm* — Venable LLP

(57) ABSTRACT

A method of manufacturing a semiconductor device includes forming a first photoresist film over a substrate, exposing a first pattern including an alignment pattern in a first region, forming, on the substrate, an alignment mark corresponding to the exposed alignment pattern, forming a second photoresist film over the substrate on which the alignment mark is formed, dividing a second pattern into a plurality of regions and exposing the divided regions separately in a second region while performing positioning with respect to the alignment mark, and developing the second photoresist film and forming the second photoresist film having the second pattern, wherein at least a part of the second region is located outside an effective exposure region of an exposure apparatus in exposure of the first pattern.

14 Claims, 9 Drawing Sheets

(51) Int. Cl.
*H01L 23/544* (2006.01)
*H01L 21/308* (2006.01)
*H01L 21/027* (2006.01)
*H01L 21/311* (2006.01)
*H01L 21/033* (2006.01)
*G03F 9/00* (2006.01)
*G03F 7/20* (2006.01)
*G03F 1/42* (2012.01)

(52) U.S. Cl.
CPC .......... *G03F 9/7003* (2013.01); *G03F 9/7084* (2013.01); *H01L 21/0273* (2013.01); *H01L 21/0337* (2013.01); *H01L 21/3086* (2013.01); *H01L 21/31144* (2013.01); *H01L 23/544* (2013.01); *H01L 2223/54426* (2013.01)

(56) References Cited

U.S. PATENT DOCUMENTS

| | | | | |
|---|---|---|---|---|
| 2002/0130425 | A1* | 9/2002 | Koike | G03F 1/20 257/797 |
| 2006/0152723 | A1* | 7/2006 | Nohdo | G03F 1/20 356/401 |

FOREIGN PATENT DOCUMENTS

| | | |
|---|---|---|
| JP | 2006-310446 A | 11/2006 |
| JP | 2009-3074 A | 1/2009 |
| JP | 2011-232549 A | 11/2011 |

* cited by examiner

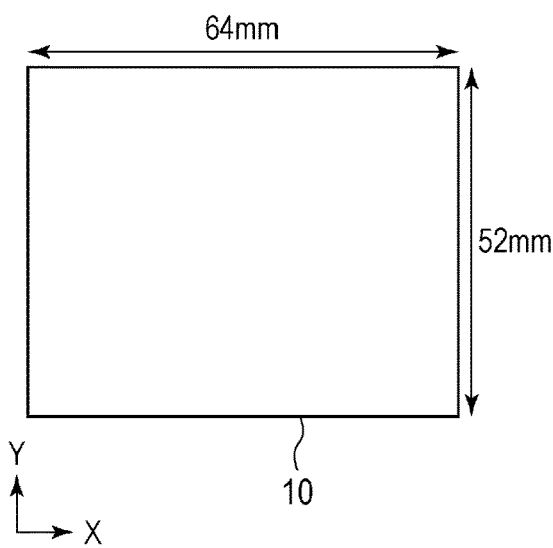
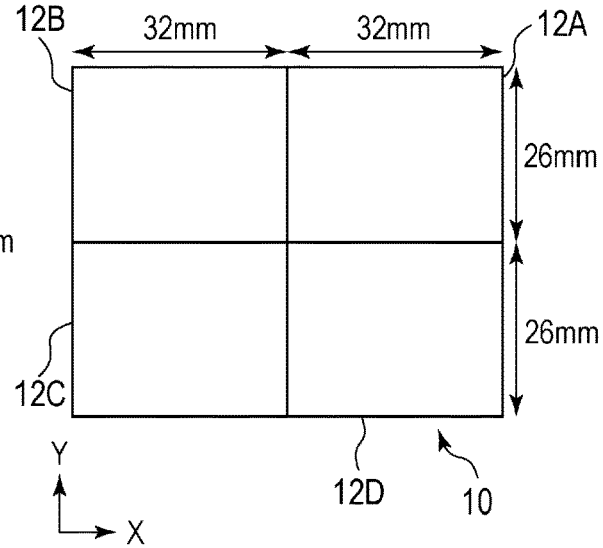
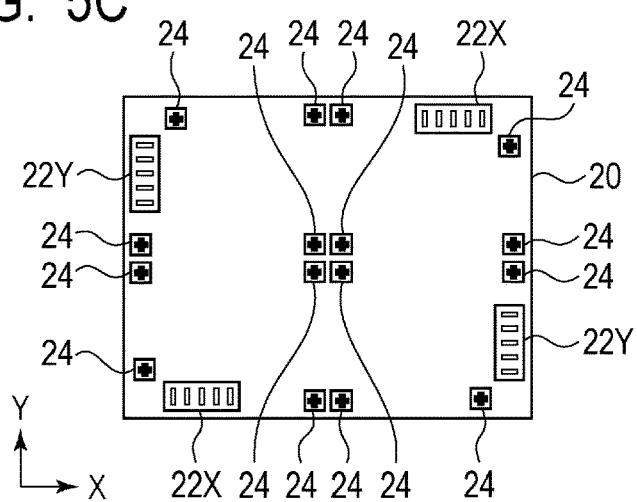
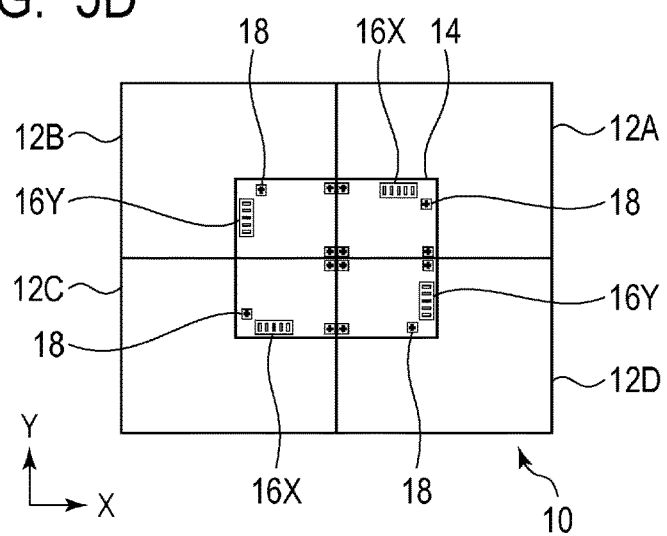

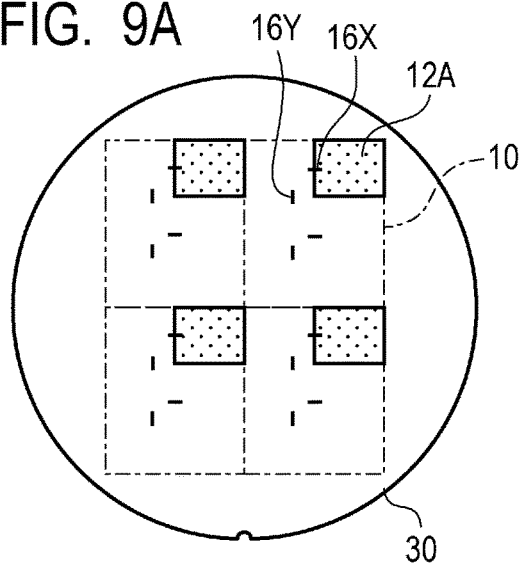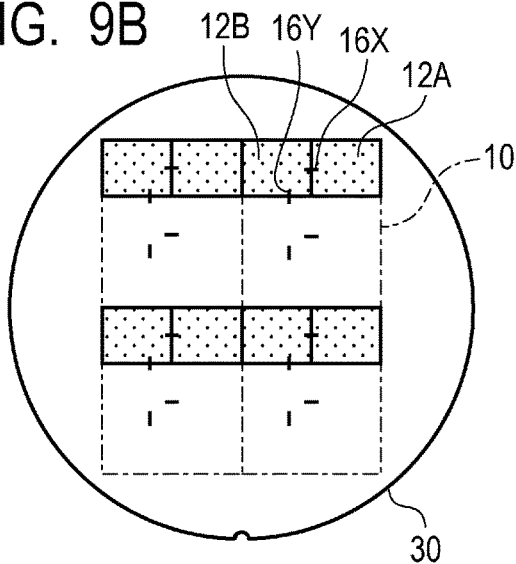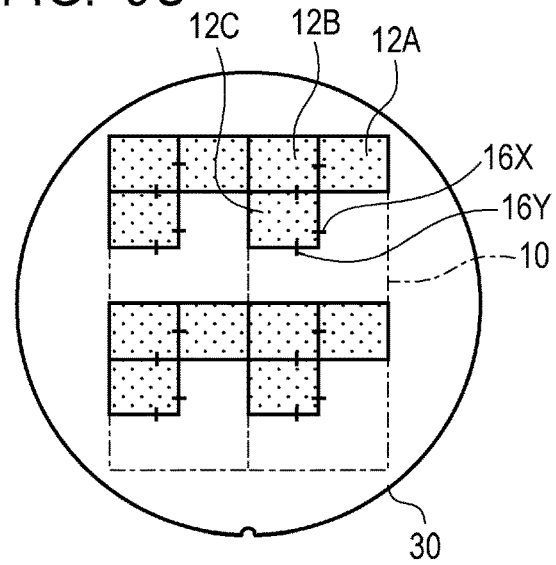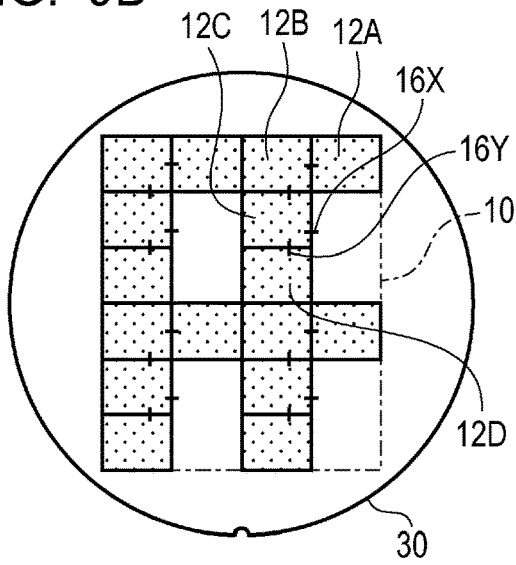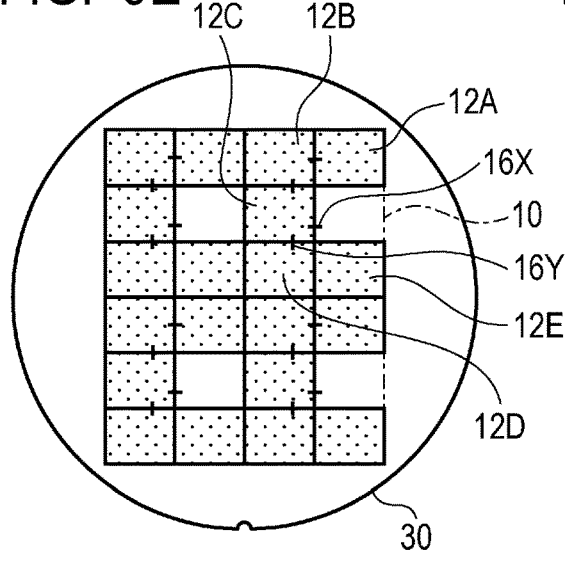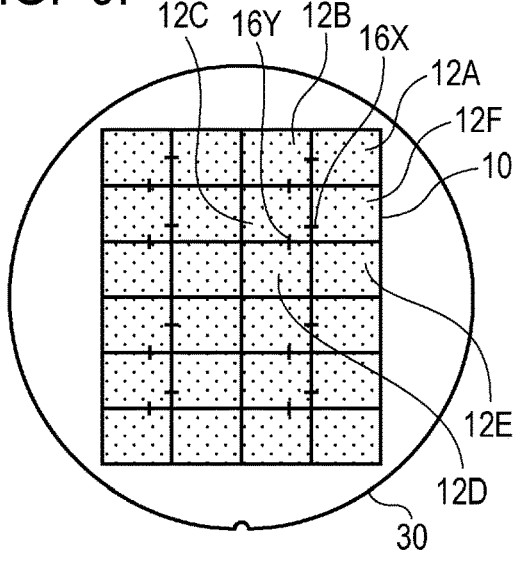

METHOD OF MANUFACTURING SEMICONDUCTOR DEVICE

BACKGROUND OF THE INVENTION

Field of the Invention

The present invention relates to a method of manufacturing a semiconductor device.

Description of the Related Art

In manufacturing of semiconductor devices, a pattern formed on a photomask (reticle) is exposed on a photoresist film formed on a semiconductor substrate, and a resist pattern formed by development is used to perform a predetermined process on the semiconductor substrate. In a semiconductor device having a chip region having a larger size than an effective exposure region of an exposure apparatus used for exposure of the pattern, a divided exposure is performed in which the chip region is divided into a plurality of regions and these divided regions are exposed, respectively, and then connected together. In the pattern formation using divided exposure, it is important how to increase the accuracy in connecting together the patterns of respective regions to be divided and exposed.

Japanese Patent Application Laid-Open No. 2006-310446 discloses a method of manufacturing a semiconductor device in which an alignment mark is provided to at least one of the divided patterns and this alignment mark is used for positioning when other divided patterns are exposed, and thereby the accuracy in connecting the divided patterns together is improved. Further, Japanese Patent Application Laid-Open No. 2011-232549 discloses a method of manufacturing a semiconductor device in which an alignment mark of neighboring divided pattern regions is used to perform divided exposure by a die-by-die alignment scheme, and thereby the accuracy in connecting respective regions together is improved.

In the method disclosed by Japanese Patent Application Laid-Open No. 2006-310446, however, the positioning accuracy of respective divided pattern regions depends on the stepping accuracy of the exposure apparatus, and thus the positioning accuracy may decrease particularly in a divided pattern region which is distant from the divided pattern region to which the alignment mark is provided. Further, in the method disclosed by Japanese Patent Application Laid-Open No. 2011-232549, since positioning is performed by using an alignment mark of neighboring divided pattern regions, the positioning accuracy between not-neighboring divided pattern regions may decrease.

SUMMARY OF THE INVENTION

The present invention intends to provide a method of manufacturing a semiconductor device that can improve the positioning accuracy between divided pattern regions when patterns are formed by divided exposure.

According to one aspect of the present invention, there is provided a method of manufacturing a semiconductor device including forming a first photoresist film over a substrate, exposing a first pattern including an alignment pattern on the first photoresist film in a first region of the substrate, forming, on the substrate, an alignment mark corresponding to the alignment pattern of the first pattern exposed on the first photoresist film, forming a second photoresist film over the substrate on which the alignment mark is formed, dividing a second pattern into a plurality of regions and exposing the divided regions separately on the second photoresist film in a second region on the substrate while performing positioning with respect to the alignment mark, and developing the second photoresist film and forming the second photoresist film having the second pattern, wherein at least a part of the second region is located outside an effective exposure region of an exposure apparatus in exposure of the first pattern.

Further features of the present invention will become apparent from the following description of exemplary embodiments with reference to the attached drawings.

BRIEF DESCRIPTION OF THE DRAWINGS

FIGS. 5A, 5B, 5C, and 5D are diagrams illustrating a general configuration of a semiconductor device according to a third embodiment of the present invention.

FIGS. 8A, 8B, 8C, 9A, 9B, 9C, 9D, 9E, and 9F are plan views illustrating a method of manufacturing a semiconductor device according to the fourth embodiment of the present invention.

DESCRIPTION OF THE EMBODIMENTS

Preferred embodiments of the present invention will now be described in detail in accordance with the accompanying drawings.

First Embodiment

A semiconductor device and a method of manufacturing the same according to a first embodiment of the present invention will be described with reference to FIG. 1A to FIG. 2D. FIG. 1A to FIG. 1D are diagrams illustrating a general configuration of a semiconductor device according to the present embodiment. FIG. 2A to FIG. 2D are plan views illustrating a method of manufacturing a semiconductor device according to the present embodiment.

Figure 1A:
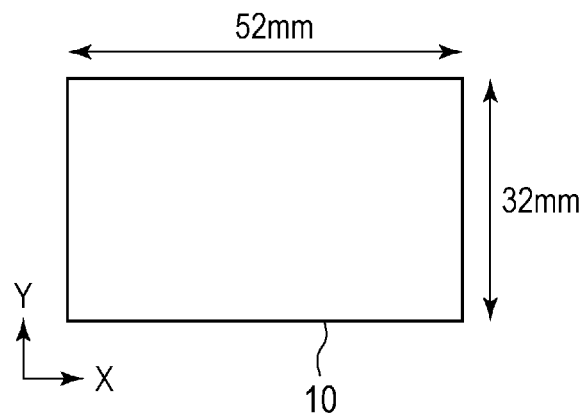
FIGS. 1A, 1B, 1C, and 1D are diagrams illustrating a general configuration of a semiconductor device according to a first embodiment of the present invention.

FIG. 1A illustrates a chip region 10 on a semiconductor substrate of the semiconductor device according to the present embodiment. Here, the chip region 10 is a region on a semiconductor substrate corresponding to the chip size of a semiconductor device. The chip region 10 includes all regions in which patterns required for a function, manufacturing, inspection, or the like of the semiconductor device, such as a process pattern formation region of an alignment mark, displacement inspection mark, or the like are formed, in addition to a device formation region. While the chip region 10 having a length in the X-direction of 52 mm and a length in the Y-direction of 32 mm is assumed in the present embodiment, any size of the chip region 10 may be employed.

The formation of patterns on the semiconductor substrate is performed by using photolithography. After a photoresist film is formed over the semiconductor substrate, a predetermined pattern is exposed on this photoresist film by using an exposure apparatus, the exposed photoresist film is developed, and thereby the exposed pattern is transcribed on the photoresist film. For example, the patterned photoresist film can be used as a mask in etching of the semiconductor substrate or a film provided thereon or a mask for ion implantation. The patterned photoresist film can be used as an alignment mark in a subsequent photolithography step.

The exposure apparatus used in exposure of a pattern on a photoresist film on the semiconductor substrate has an effective exposure region that is specific for the apparatus. The effective exposure region is the maximum exposure region that can be exposed by one shot and is determined by performance of a projection optical system of the exposure apparatus. In the present embodiment, an exposure apparatus having a size of the effective exposure region of 26 mm by 33 mm at the maximum is assumed. That is, the size of the chip region 10 of the semiconductor device described above is larger than the size of the effective exposure region of this exposure apparatus. Thus, in order to use this exposure apparatus to expose a pattern on the chip region 10 of the semiconductor device according to the present embodiment, it is necessary to divide the chip region 10 into a plurality of regions each smaller than the effective exposure region of the exposure apparatus and separately expose the patterns corresponding to respective divided regions.

Figure 1B:
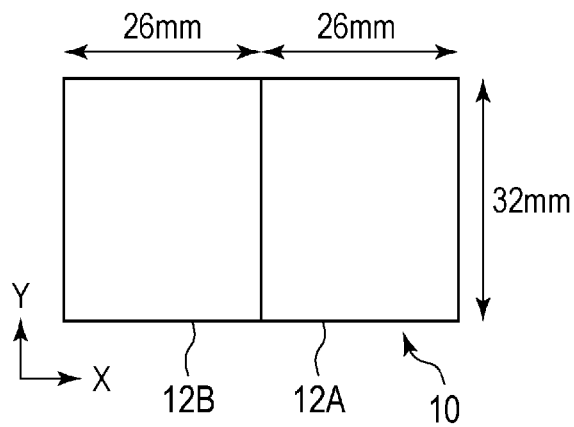

When the length in the X-direction of the effective exposure region is 26 mm and the Y-direction thereof is 33 mm, the chip region 10 of the semiconductor device according to the present embodiment has a larger size than the effective exposure region in the X-direction and the same length as the effective exposure region in the Y-direction. Therefore, as illustrated in FIG. 1B, for example, the chip region 10 is divided into two regions in the X-direction, and thereby two divided pattern regions 12A and 12B each having a length in the X-direction of 26 mm and a length in the Y-direction of 32 mm can be defined within the chip region 10.

Note that the divided pattern regions 12 are not necessarily required to have the same size. Further, the chip region 10 may be divided into three or more divided pattern regions 12. Further, an overlapping region is provided between the neighboring divided pattern regions 12 taking positioning shift into consideration, though not depicted or described here for simplicity.

In the method of manufacturing the semiconductor device according to the present embodiment, prior to exposure of patterns on the divided pattern regions 12A and 12B, an alignment mark used for positioning in the exposure of these patterns is formed on the semiconductor substrate. The formation of the alignment mark is performed through lithography using a reticle which is different from the reticle used for exposing the divided pattern regions 12A and 12B.

Figure 1C:
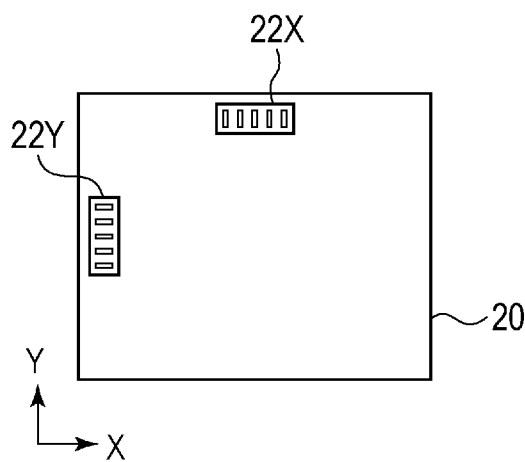

FIG. 1C is a schematic diagram of a reticle 20 used for lithography in forming an alignment mark on the semiconductor substrate. The reticle 20 includes a pattern of an alignment mark used in X-direction alignment (alignment pattern 22X) and a pattern of an alignment mark used in Y-direction alignment (alignment pattern 22Y) as illustrated in FIG. 1C. In the reticle 20, at least a set of the alignment patterns 22X and 22Y are provided. In terms of improving the positioning accuracy, it is desirable to provide two or more sets of the alignment patterns 22X and 22Y. Note that the reticle 20 may be a dedicated reticle for forming the alignment mark, or may be a reticle including other patterns than the alignment pattern.

Figure 1D:
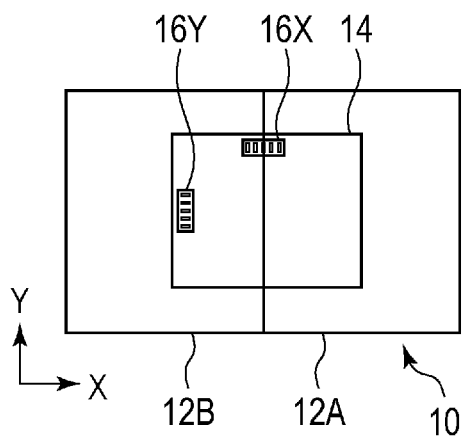

FIG. 1D is a diagram illustrating a relationship between a region (alignment mark arrangement region 14) in which a pattern is arranged on the semiconductor substrate by lithography using the reticle 20, and the divided pattern regions 12A and 12B. Within the alignment mark arrangement region 14, alignment marks 16X and 16Y based on the alignment patterns 22X and 22Y on the reticle 20 are arranged. The alignment marks 16X and 16Y are not necessarily required to be arranged in an overlapping region between the divided pattern region 12A and the divided pattern region 12B, and may be arranged in a region other than the overlapping region.

At least a part of the chip region 10 is located outside the effective exposure region of the exposure apparatus in exposure of patterns including the alignment patterns 22X and 22Y For example, the alignment mark arrangement region 14 is smaller than the size of the chip region 10 and arranged inside the circumference of the chip region 10 as illustrated in FIG. 1D. Further, at least a part of the divided pattern region 12A and at least a part of the divided pattern region 12B are arranged in a region outside the alignment mark arrangement region 14. An exposure apparatus used for exposure of the patterns on the divided pattern regions 12A and 12B or an exposure apparatus having the effective exposure region that is equal thereto can be applied to the photolithography using the reticle 20. It is not necessary to separately prepare an exposure apparatus having the effective exposure region that can cover the entire chip region 10.

It is desirable for each of the divided pattern regions 12A and 12B to have a region overlapping with the alignment mark arrangement region 14. Such a configuration allows for a shorter distance from each of the alignment marks 16X and 16Y arranged inside the alignment mark arrangement region 14 to each of the divided pattern regions 12A and 12B, and this can improve the positioning accuracy.

Next, the method of manufacturing the semiconductor device according to the present embodiment will be more specifically described by using FIG. 2A to FIG. 2D. Here, the method of manufacturing the semiconductor device according to the present embodiment will be described with an example of a case of performing an initial exposure step in the manufacturing of the semiconductor device and an etching step as a subsequent step. That is, it is assumed that no alignment mark is formed on the semiconductor substrate that has not yet been subjected to the steps described below. On the semiconductor substrate, however, an alignment mark other than an alignment mark described below may be formed. Further, an insulating film, a conductive film, or the like may be formed over the semiconductor substrate. Note that, when simply denoted as "substrate" in the present specification, it includes not only a semiconductor substrate itself but also a semiconductor substrate on which an insulating film, a conductive film, or the like is formed. Further, patterning a substrate means not only patterning a semiconductor substrate included in the substrate but also patterning an insulating film or a conductive film included in the substrate.

First, the reticle 20 provided with the alignment patterns 22X and 22Y, a reticle provided with a predetermined pattern to be exposed on the divided pattern region 12A, and a reticle provided with a predetermined pattern to be exposed on the divided pattern region 12B are prepared.

Next, a photoresist material is spin-coated over a semiconductor substrate to be processed, prebake is performed thereon, and thereby a semiconductor substrate 30 provided with a photoresist film over the surface is prepared.

Next, the reticle 20 in which the alignment patterns 22X and 22Y are provided is set in the exposure apparatus. The exposure apparatus mounts the reticle 20 on a reticle stage and performs positioning of the reticle 20 with the reticle stage.

Next, the semiconductor substrate 30 on which the photoresist film is provided is set in the exposure apparatus. The exposure apparatus mounts the semiconductor substrate 30 on a wafer stage.

Next, the exposure apparatus controls the wafer stage to expose the pattern provided in the reticle 20 on the semiconductor substrate 30 while moving the semiconductor substrate 30 in the X-direction and the Y-direction at a pitch corresponding to the length in the X-direction and the length in the Y-direction of the chip region 10.

Figure 2A:
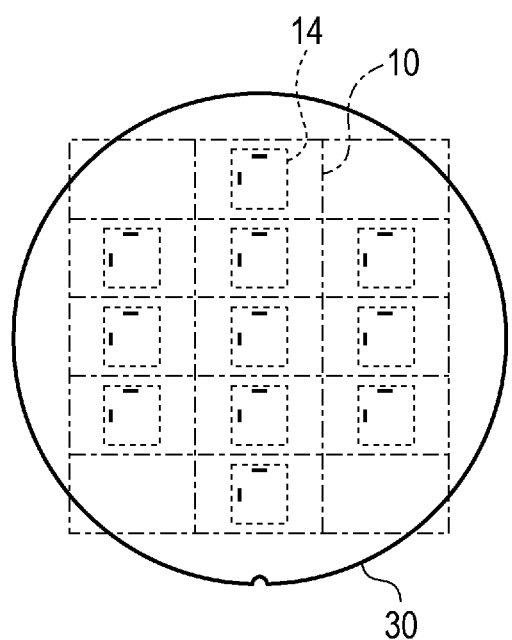
FIGS. 2A, 2B, 2C, and 2D are plan views illustrating a method of manufacturing a semiconductor device according to the first embodiment of the present invention.

For example, each of the regions partitioned by a one-dot-chain line in FIG. 2A corresponds to the chip region 10. Information on the arrangement of the chip regions 10 on the semiconductor substrate 30, such as coordinates of the chip region 10, the pitch or the number in the X-direction and the Y-direction, is input in advance to the exposure apparatus as arrangement reference information of the semiconductor device of interest. The exposure apparatus refers to this arrangement reference information and moves the semiconductor substrate 30 mounted on the wafer stage in the X-direction and the Y-direction at a predetermined pitch by a step-and-repeat scheme. Then, an illumination light passing through the reticle 20 is irradiated on the semiconductor substrate 30 for each motion, the pattern (the alignment patterns 22X and 22Y) provided in the reticle 20 is projected in a reduced size onto the semiconductor substrate 30. Thereby, latent images corresponding to the alignment patterns 22X and 22Y are formed in the photoresist film of the semiconductor substrate 30.

In such a way, the patterns provided in the reticle 20 are exposed within each of the chip regions 10 of the semiconductor substrate 30 defined by the arrangement reference information, respectively. Each of the regions partitioned by a dotted line in FIG. 2A is the alignment mark arrangement region 14 on which the patterns provided in the reticle 20 are exposed.

Next, the semiconductor substrate 30 on which the patterns provided in the reticle 20 have been exposed is extracted from the exposure apparatus, and the exposed photoresist film is developed by using a developing fluid. Thereby, a photoresist film having the alignment marks 16X and 16Y corresponding to the alignment patterns 22X and 22Y on the reticle 20 is formed within each of the chip regions 10 of the semiconductor substrate 30.

Next, the semiconductor substrate 30 is etched using the photoresist film as a mask in which the alignment marks 16X and 16Y are formed, and the alignment marks 16X and 16Y are transcribed on the semiconductor substrate 30. The photoresist film over the semiconductor substrate 30 is then removed by ashing or the like.

Figure 2B:
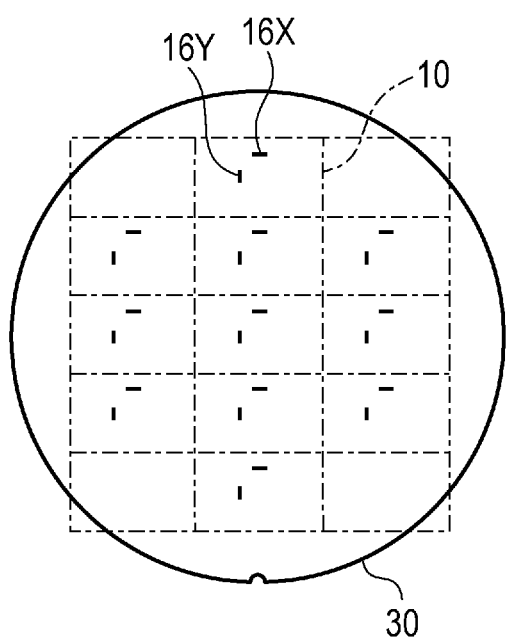

In such a way, the alignment marks 16X and 16Y formed of a difference in level on the surface of the semiconductor substrate 30 are formed within each of the chip regions 10 of the semiconductor substrate 30 (FIG. 2B).

Next, a reticle provided with a predetermined pattern to be exposed on the divided pattern region 12A and a reticle provided with a predetermined pattern to be exposed on the divided pattern region 12B are set in the exposure apparatus.

Next, a photoresist film is again formed over the semiconductor substrate 30 on which the alignment marks 16X and 16Y are formed, which is set in the exposure apparatus. The exposure apparatus mounts the semiconductor substrate 30 on the wafer stage.

Next, the exposure apparatus mounts a reticle provided with a predetermined pattern to be exposed on the divided pattern region 12A on the reticle stage and performs positioning with respect to the reticle stage.

Next, the exposure apparatus measures the alignment marks 16X and 16Y for several shots formed on the semiconductor substrate 30 and examines alignment information indicating coordinate positions of the alignment marks 16X and 16Y on the semiconductor substrate 30. The components of a shift in the X-direction and Y-direction, a rotational shift, a magnification error, or the like of the alignment mark arrangement region 14 are then calculated from the examined alignment information. Furthermore, the original arrangement reference information is corrected taking these components into consideration.

Figure 2C:
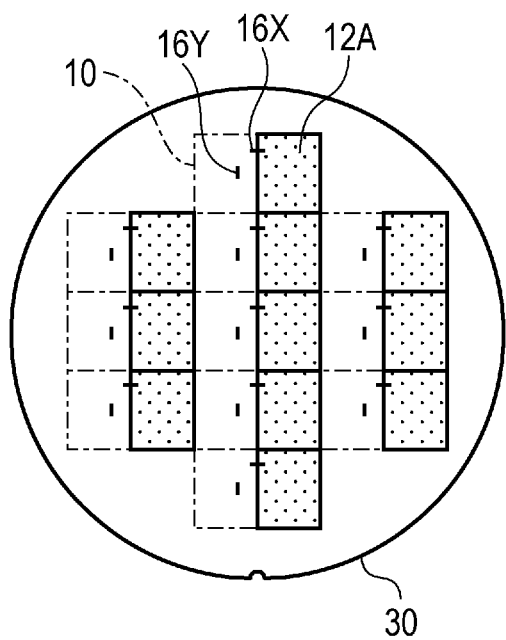

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12A. Thereby, a latent image of the pattern exposed on the divided pattern region 12A is formed on the photoresist film of the semiconductor substrate 30 (FIG. 2C).

Next, after extracting the reticle on the reticle stage, the exposure apparatus mounts the reticle provided with a predetermined pattern to be exposed on the divided pattern region 12B on the reticle stage and performs positioning with respect to the reticle stage.

Figure 2D:
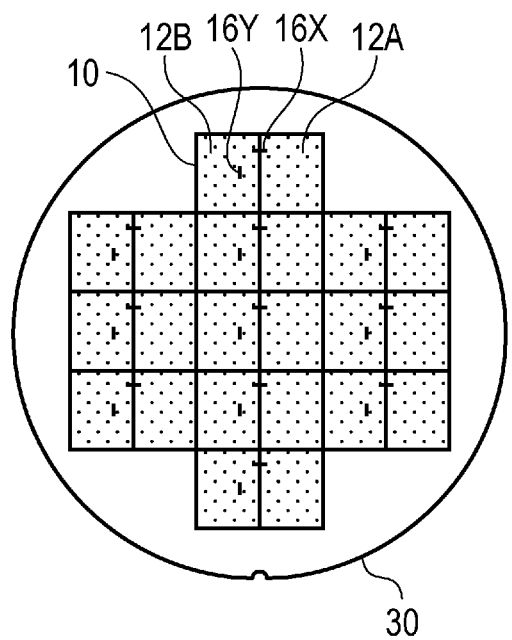

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12B. Thereby, a latent image of the pattern exposed on the divided pattern region 12B is formed on the photoresist film of the semiconductor substrate 30 (FIG. 2D).

Next, the semiconductor substrate 30 on which the exposure of the patterns on the divided pattern regions 12A and 12B is completed is extracted from the exposure apparatus, and the exposed photoresist film is developed by using a developing fluid. Thereby, a photoresist film having a predetermined pattern is formed within each of the chip regions 10 of the semiconductor substrate 30.

Next, the patterned photoresist film is used to perform a predetermined process on the semiconductor substrate 30. For example, the semiconductor substrate 30 or the film provided thereon is etched using the photoresist film as a mask, and the pattern of the photoresist film is transcribed on the semiconductor substrate 30 or the film provided thereon. Alternatively, ion implantation is performed using the photoresist film as a mask to add an impurity to a predetermined region of the semiconductor substrate 30. Then, the photoresist film on the semiconductor substrate 30 is removed by ashing or the like.

As discussed above, in the method of manufacturing the semiconductor device according to the present embodiment, the same alignment mark is used to perform exposure on the plurality of divided pattern regions 12A and 12B forming the chip region 10. Therefore, according to the present embodiment, the accuracy in connecting together the pattern formed in the divided pattern region 12A and the pattern formed in the divided pattern region 12B can be improved.

Second Embodiment

A method of manufacturing a semiconductor device according to a second embodiment of the present invention will be described with reference to FIG. 3A to FIG. 4F. The same components as those in the semiconductor device and the method of manufacturing the same according to the first embodiment are labeled with the same reference numerals, and the description thereof will be omitted or simplified. FIG. 3A to FIG. 3D are diagrams illustrating a general configuration of a semiconductor device according to the present embodiment. FIG. 4A to FIG. 4F are plan views illustrating a method of manufacturing a semiconductor device according to the present embodiment.

Figure 3A:
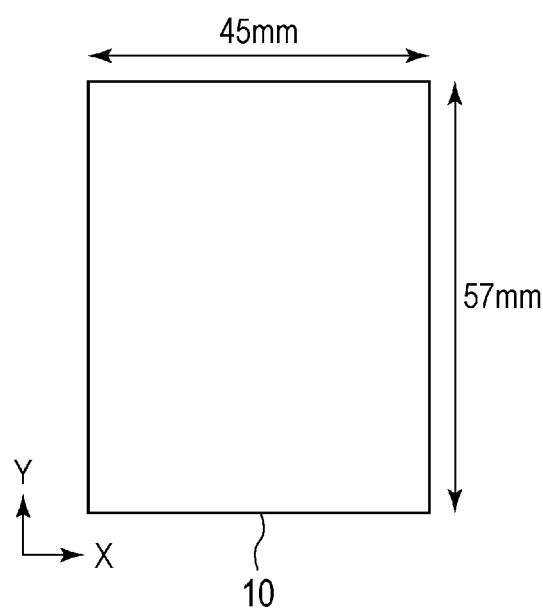
FIGS. 3A, 3B, 3C, and 3D are diagrams illustrating a general configuration of a semiconductor device according to a second embodiment of the present invention.

FIG. 3A illustrates a chip region 10 of the semiconductor device according to the present embodiment. In the present embodiment, the chip region 10 having a length in the X-direction of 45 mm and a length in the Y-direction of 57 mm is assumed. In the same manner as the first embodiment, when the exposure apparatus whose maximum size of the effective exposure region is 26 mm by 33 mm is assumed, the size in the X-direction and the Y-direction of the chip region 10 of the semiconductor device according to the present embodiment is larger than the size of the effective exposure region of this exposure apparatus.

Figure 3B:
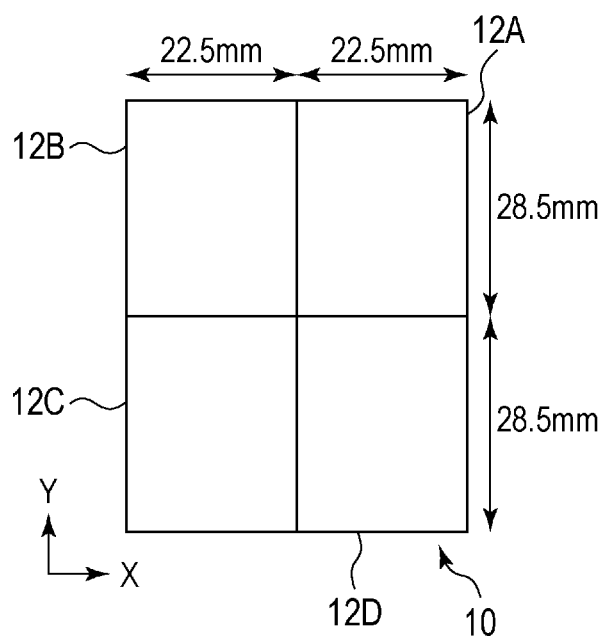

The chip region 10 of the semiconductor device according to the present embodiment is larger than the size of the effective exposure region in both the sizes in the X-direction and the Y-direction. Therefore, as illustrated in FIG. 3B, for example, four divided pattern regions 12A, 12B, 12C, and 12D each having a length in the X-direction of 22.5 mm and a length in the Y-direction of 28.5 mm can be defined within the chip region 10. The divided pattern region 12 is aligned two-dimensionally instead of one-dimensionally as in the case of the first embodiment, and thereby a semiconductor device having a much larger size of the chip region 10 can be handled. Note that the divided pattern regions 12 are not necessarily required to have the same size. Further, the chip region 10 may be divided into five or more divided pattern regions 12.

Also in the method of manufacturing the semiconductor device according to the present embodiment, prior to exposure of patterns on the divided pattern regions 12A, 12B, 12C, and 12D, an alignment mark used for positioning in the exposure of these patterns is formed on the semiconductor substrate. The formation of the alignment mark is performed through lithography using a reticle which is different from the reticle used for exposing the divided pattern regions 12A, 12B, 12C, and 12D.

Figure 3C:
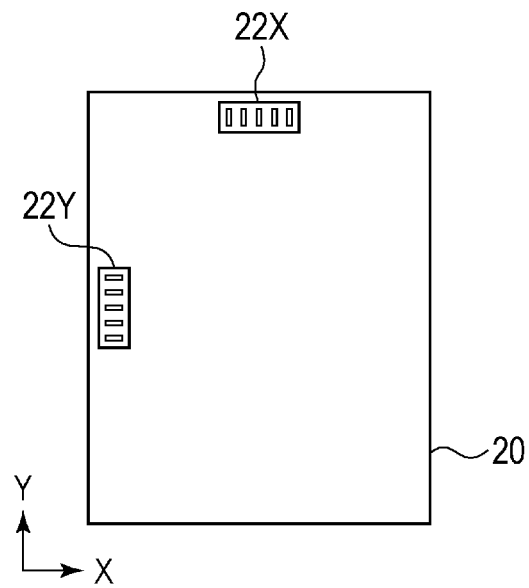

FIG. 3C is a schematic diagram of the reticle 20 used for lithography in forming an alignment mark on the semiconductor substrate. The reticle 20 includes the alignment pattern 22X used in X-direction alignment and the alignment pattern 22Y used in Y-direction alignment as illustrated in FIG. 3C. In the reticle 20, at least one set of the alignment patterns 22X and 22Y are provided.

Figure 3D:
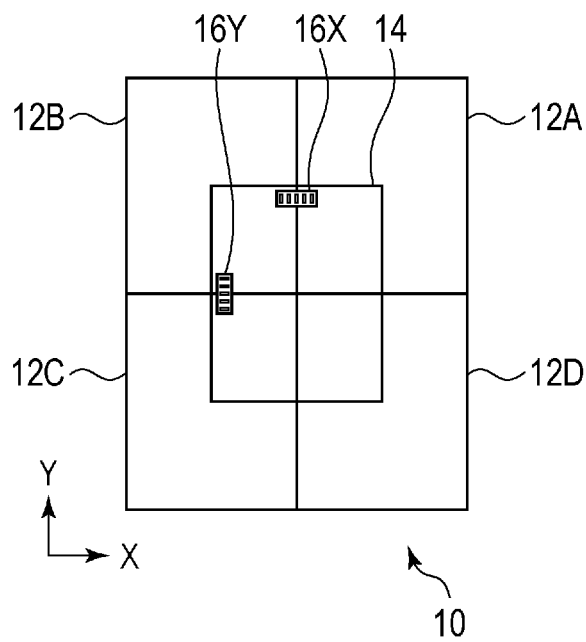

FIG. 3D is a diagram illustrating a relationship among the divided pattern regions 12A, 12B, 12C, and 12D and a region (the alignment mark arrangement region 14) in which a pattern is arranged on the semiconductor substrate by lithography using the reticle 20. Within the alignment mark arrangement region 14, the alignment marks 16X and 16Y based on the alignment patterns 22X and 22Y on the reticle 20 are arranged.

At least a part of the chip region 10 is located outside the effective exposure region of the exposure apparatus in exposure of patterns including the alignment patterns 22X and 22Y For example, the alignment mark arrangement region 14 is smaller than the size of the chip region 10 and arranged inside the circumference of the chip region 10 as illustrated in FIG. 3D. At least a part of each of the divided pattern regions 12A, 12B, 12C, and 12D is arranged in a region outside the alignment mark arrangement region 14.

It is desirable for each of the divided pattern regions 12A, 12B, 12C, and 12D to have regions overlapping with the alignment mark arrangement region 14. Such a configuration allows for a shorter distance from each of the alignment marks 16X and 16Y arranged inside the alignment mark arrangement region 14 to each of the divided pattern regions 12A, 12B, 12C, and 12D, and this can improve the positioning accuracy.

Note that, as a divided exposure method using the layout illustrated in FIG. 3B, it appears to be possible to employ a first method and a second method illustrated below, for example.

The first method is a method of using an alignment mark formed in the neighboring divided pattern regions to perform positioning. For example, first, a predetermined pattern including an alignment mark is formed in the divided pattern region 12B. Next, the alignment mark formed in the divided pattern region 12B is used to form predetermined patterns including the alignment marks in the divided pattern regions 12A and 12C, respectively. Next, the alignment mark formed in the divided pattern region 12A or the divided pattern region 12C is used to form a predetermined pattern in the divided pattern region 12D.

The second method is a method of using alignment mark formed in one divided pattern region to perform positioning of remaining divided pattern regions. For example, first, a predetermined pattern including an alignment mark is formed in the divided pattern region 12B. Next, the alignment mark formed in the divided pattern region 12B is used to form predetermined patterns in the divided pattern regions 12A, 12C, and 12D, respectively.

In the first method, however, positioning of the divided pattern region 12D to the divided pattern region 12B is indirect positioning via the use of the pattern of the divided pattern region 12A or the divided pattern region 12C, and thus the accuracy in connecting-together may be decrease. Further, in the second method, since the distance from the divided pattern region 12B to the divided pattern region 12D is large and the positioning accuracy significantly depends on the stepping accuracy of the exposure apparatus, the accuracy in connecting-together may decrease.

In this regard, according to the method of manufacturing the semiconductor device according to the present embodiment, since the same alignment mark is used to perform positioning of a plurality of divided pattern regions, this can improve the accuracy in connecting together the divided pattern regions. Further, since a common alignment mark can be arranged near a plurality of divided pattern regions, the influence of the stepping accuracy of the exposure apparatus can be reduced, and the accuracy in connecting the divided pattern regions together can be improved.

Next, the method of manufacturing the semiconductor device according to the present embodiment will be more specifically described by using FIG. 4A to FIG. 4F. Here, the method of manufacturing the semiconductor device according to the present embodiment will be described with an example of a case of performing an initial exposure step in the manufacturing of the semiconductor device and an etching step as a subsequent step.

First, the reticle 20 in which the alignment patterns 22X and 22Y are provided is prepared. Further, reticles provided with predetermined patterns to be exposed on the divided pattern regions 12A, 12B, 12C, and 12D are prepared, respectively.

Next, a photoresist material is spin-coated over a semiconductor substrate to be processed, prebake is performed thereon, and thereby a semiconductor substrate 30 provided with a photoresist film over the surface is prepared.

Next, the reticle 20 in which the alignment patterns 22X and 22Y are provided is set in the exposure apparatus. The exposure apparatus mounts the reticle 20 on a reticle stage and performs positioning of the reticle 20 with the reticle stage.

Next, the semiconductor substrate 30 on which the photoresist film is provided is set in the exposure apparatus. The exposure apparatus mounts the semiconductor substrate 30 on a wafer stage.

Next, the exposure apparatus controls the wafer stage to expose the pattern provided in the reticle 20 on the semiconductor substrate 30 while moving the semiconductor substrate 30 in the X-direction and the Y-direction at a pitch corresponding to the length in the X-direction and the length in the Y-direction of the chip region 10.

Figure 4A:
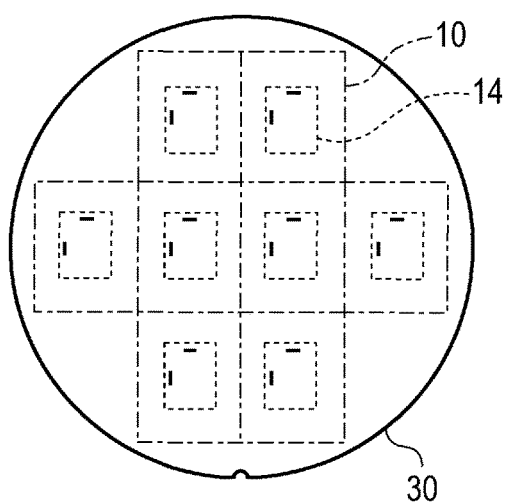
FIGS. 4A, 4B, 4C, 4D, 4E, and 4F are plan views illustrating a method of manufacturing a semiconductor device according to the second embodiment of the present invention.

For example, each of the regions partitioned by a one-dot-chain line in FIG. 4A corresponds to the chip region 10. Information on the arrangement of the chip regions 10 on the semiconductor substrate 30, such as coordinates of the chip region 10, the pitch or the number in the X-direction and the Y-direction, is input in advance to the exposure apparatus as arrangement reference information of the semiconductor device of interest. The exposure apparatus refers to this arrangement reference information and moves the semiconductor substrate 30 mounted on the wafer stage in the X-direction and the Y-direction at a predetermined pitch by a step-and-repeat scheme. Then, an illumination light passing through the reticle 20 is irradiated on the semiconductor substrate 30 for each motion, and the pattern (the alignment patterns 22X and 22Y) provided in the reticle 20 is projected in a reduced size onto the semiconductor substrate 30. Thereby, latent images corresponding to the alignment patterns 22X and 22Y are formed in the photoresist film of the semiconductor substrate 30.

In such a way, the patterns provided in the reticle 20 are exposed within each of the chip regions 10 of the semiconductor substrate 30 defined by the arrangement reference information, respectively. Each of the regions partitioned by a dotted line in FIG. 4A is the alignment mark arrangement region 14 on which the patterns provided in the reticle 20 are exposed.

Next, the semiconductor substrate 30 on which the patterns provided in the reticle 20 have been exposed is extracted from the exposure apparatus, and the exposed photoresist film is developed by using a developing fluid. Thereby, the alignment marks 16X and 16Y corresponding to the alignment patterns 22X and 22Y on the reticle 20 are formed within each of the chip regions 10 of the semiconductor substrate 30.

Next, the semiconductor substrate 30 is etched using the photoresist film as a mask in which the alignment marks 16X and 16Y are formed, and the alignment marks 16X and 16Y are transcribed on the semiconductor substrate 30. The photoresist film on the semiconductor substrate 30 is then removed by ashing or the like.

Figure 4B:
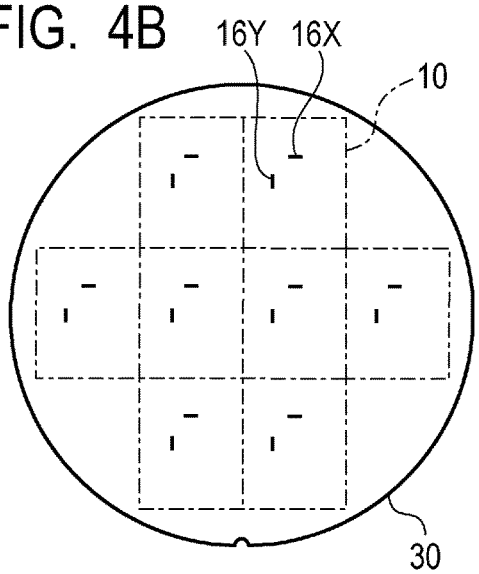

In such a way, the alignment marks 16X and 16Y formed of a difference in level on the surface of the semiconductor substrate 30 are formed within each of the chip regions 10 of the semiconductor substrate 30 (FIG. 4B).

Next, four reticles each provided with a predetermined pattern to be exposed on the divided pattern regions 12A, 12B, 12C, and 12D are set in the exposure apparatus.

Next, a photoresist film is again formed over the semiconductor substrate 30 on which the alignment marks 16X and 16Y are formed, which is set in the exposure apparatus. The exposure apparatus mounts the semiconductor substrate 30 on the wafer stage.

Next, the exposure apparatus mounts a reticle provided with a predetermined pattern to be exposed on the divided pattern region 12A on the reticle stage and performs positioning with respect to the reticle stage.

Next, the exposure apparatus measures the alignment marks 16X and 16Y for several shots formed on the semiconductor substrate 30 and examines alignment information indicating coordinate positions of the alignment marks 16X and 16Y on the semiconductor substrate 30. The components of a shift in the X-direction and Y-direction, a rotational shift, a magnification error, or the like of the alignment mark arrangement region 14 are then calculated from the examined alignment information. Furthermore, the original arrangement reference information is corrected taking these components into consideration.

Figure 4C:
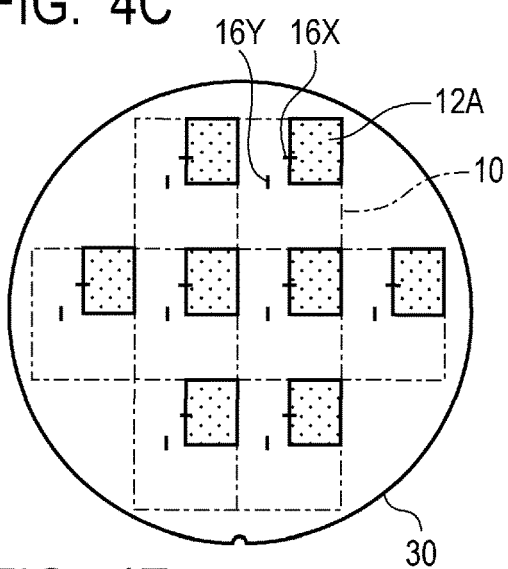

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12A. Thereby, a latent image of the pattern exposed on the divided pattern region 12A is formed on the photoresist film of the semiconductor substrate 30 (FIG. 4C).

Next, after extracting the reticle on the reticle stage, the exposure apparatus mounts the reticle provided with a predetermined pattern to be exposed on the divided pattern region 12B on the reticle stage and performs positioning with respect to the reticle stage.

Figure 4D:
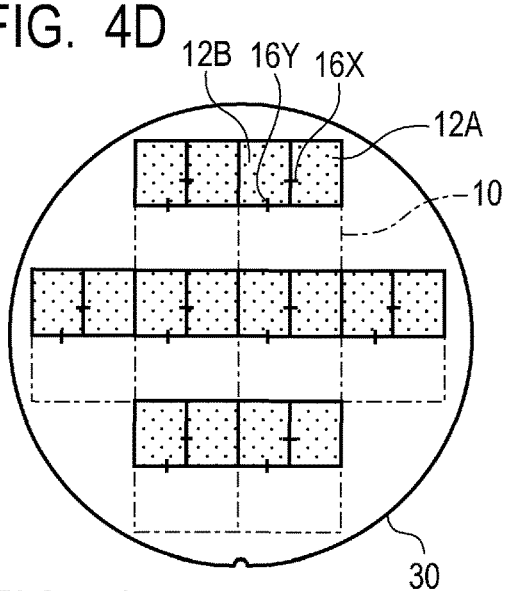

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12B. Thereby, a latent image of the pattern exposed on the divided pattern region 12B is formed on the photoresist film of the semiconductor substrate 30 (FIG. 4D).

Next, after extracting the reticle on the reticle stage, the exposure apparatus mounts a reticle provided with a predetermined pattern to be exposed on the divided pattern region 12C on the reticle stage and performs positioning with respect to the reticle stage.

Figure 4E:
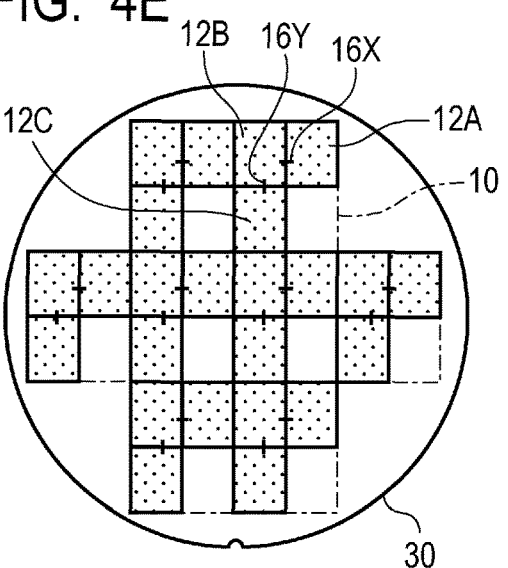

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12C. Thereby, a latent image of the pattern exposed on the divided pattern region 12C is formed on the photoresist film of the semiconductor substrate 30 (FIG. 4E).

Next, after extracting the reticle on the reticle stage, the exposure apparatus mounts a reticle provided with a predetermined pattern to be exposed on the divided pattern region 12D on the reticle stage and performs positioning with respect to the reticle stage.

Figure 4F:
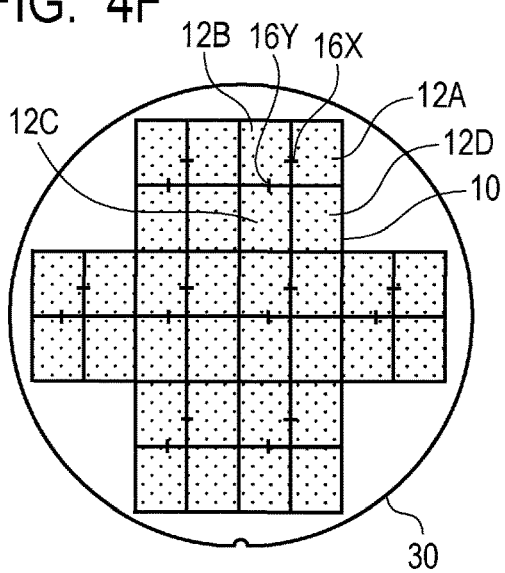

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12D. Thereby, a latent image of the pattern exposed on the divided pattern region 12D is formed on the photoresist film of the semiconductor substrate 30 (FIG. 4F).

Next, the semiconductor substrate 30 on which the exposure of the patterns on the divided pattern regions 12A, 12B, 12C, and 12D is completed is extracted from the exposure apparatus, and the exposed photoresist film is developed by using a developing fluid. Thereby, a photoresist film having a predetermined pattern is formed within each of the chip regions 10 of the semiconductor substrate 30.

Next, the patterned photoresist film is used to perform a predetermined process on the semiconductor substrate 30. For example, the semiconductor substrate 30 or the film provided thereon is etched using the photoresist film as a mask, the pattern of the photoresist film is transcribed on the semiconductor substrate 30 or the film provided thereon. Alternatively, ion implantation is performed using the photoresist film as a mask to add an impurity to a predetermined region of the semiconductor substrate 30. Then, the photoresist film on the semiconductor substrate 30 is removed by ashing or the like.

As discussed above, in the method of manufacturing the semiconductor device according to the present embodiment, the same alignment mark is used to perform exposure on the plurality of divided pattern regions 12A to 12D forming the chip region 10. Therefore, according to the present embodiment, the accuracy in connecting together the divided pattern region 12A to 12D can be improved.

Third Embodiment

A method of manufacturing a semiconductor device according to a third embodiment of the present invention will be described with reference to FIG. 5A to FIG. 6F. The same components as those in the semiconductor devices and the methods of manufacturing the same according to the first and second embodiments are labeled with the same reference numerals, and the description thereof will be omitted or simplified. FIG. 5A to FIG. 5D are diagrams illustrating a general configuration of a semiconductor device according to the present embodiment. FIG. 6A to FIG. 6F are plan views illustrating a method of manufacturing a semiconductor device according to the present embodiment.

FIG. 5A illustrates the chip region 10 of the semiconductor device according to the present embodiment. In the present embodiment, the chip region 10 having a length in the X-direction of 64 mm and a length in the Y-direction of 52 mm is assumed. In the same manner as the first embodiment, when the exposure apparatus whose maximum size of the effective exposure region is 26 mm by 33 mm is assumed, the size in the X-direction and the Y-direction of the chip region 10 of the semiconductor device according to the present embodiment is larger than the size of the effective exposure region of this exposure apparatus.

The chip region 10 of the semiconductor device according to the present embodiment is larger than the size of the effective exposure region in both the sizes in the X-direction and the Y-direction. Therefore, as illustrated in FIG. 5B, for example, four divided pattern regions 12A, 12B, 12C, and 12D each having a length in the X-direction of 32 mm and a length in the Y-direction of 26 mm can be defined within the chip region 10. Note that the divided pattern regions 12 are not necessarily required to have the same size. Further, the chip region 10 may be divided into five or more divided pattern regions 12.

Also in the method of manufacturing the semiconductor device according to the present embodiment, prior to exposure of patterns on the divided pattern regions 12A, 12B, 12C, and 12D, an alignment mark used for positioning in the exposure of these patterns is formed on the semiconductor substrate. The formation of the alignment mark is performed through lithography using a reticle which is different from the reticle used for exposing the divided pattern regions 12A, 12B, 12C, and 12D.

FIG. 5C is a schematic diagram of the reticle 20 used for lithography in forming an alignment mark on the semiconductor substrate. The reticle 20 includes the alignment patterns 22X used in X-direction alignment and the alignment patterns 22Y used in Y-direction alignment as illustrated in FIG. 5C. The reticle 20 further includes alignment accuracy measuring patterns 24 used for checking the alignment accuracy in pattern exposure with respect to the divided pattern regions 12A, 12B, 12C, and 12D.

FIG. 5D is a diagram illustrating a relationship among the divided pattern regions 12A, 12B, 12C, and 12D and a region (the alignment mark arrangement region 14) in which a pattern is arranged on the semiconductor substrate by lithography using the reticle 20.

At least a part of the chip region 10 is located outside the effective exposure region of the exposure apparatus in exposure of patterns including the alignment patterns 22X and 22Y and the alignment accuracy measuring patterns 24. For example, the alignment mark arrangement region 14 is smaller than the size of the chip region 10 and arranged inside the circumference of the chip region 10 as illustrated in FIG. 5D. Each of the divided pattern regions 12A, 12B, 12C, and 12D has a region overlapping with the alignment mark arrangement region 14.

Within the alignment mark arrangement region 14, the alignment marks 16X and 16Y based on the alignment patterns 22X and 22Y on the reticle 20 are arranged. In the example of FIG. 5D, the alignment marks 16X are arranged in a region where the divided pattern region 12A and the alignment mark arrangement region 14 overlap with each other and a region where the divided pattern region 12C and the alignment mark arrangement region 14 overlap with each other. Further, the alignment marks 16Y are arranged in a region where the divided pattern region 12B and the alignment mark arrangement region 14 overlap with each other and a region where the divided pattern region 12D and the alignment mark arrangement region 14 overlap with each other.

Further, within the alignment mark arrangement region 14, alignment accuracy measuring marks 18 based on the alignment accuracy measuring patterns 24 are arranged on the reticle 20. In the example of FIG. 5D, a plurality of alignment accuracy measuring marks 18 are arranged in the regions overlapping with the divided pattern regions 12A, 12B, 12C, and 12D, respectively.

With such a configuration, the accuracy in connecting together the divided pattern regions can be improved in the same manner as the case of the second embodiment. Further, the alignment accuracy of each divided pattern region can be improved.

Next, the method of manufacturing the semiconductor device according to the present embodiment will be more specifically described by using FIG. 6A to FIG. 6F. Here, the method of manufacturing the semiconductor device according to the present embodiment will be described with an example of a case of performing an initial exposure step in the manufacturing of the semiconductor device and an etching step as a subsequent step.

First, the reticle 20 in which the alignment patterns 22X and 22Y and the alignment accuracy measuring patterns 24 are provided is prepared. Further, reticles provided with predetermined patterns to be exposed on the divided pattern regions 12A, 12B, 12C, and 12D are prepared, respectively.

Next, a photoresist material is spin-coated over a semiconductor substrate to be processed, prebake is performed thereon, and thereby a semiconductor substrate 30 provided with a photoresist film over the surface is prepared.

Next, the reticle 20 in which the alignment patterns 22X and 22Y and the alignment accuracy measuring patterns 24 are provided is set in the exposure apparatus. The exposure apparatus mounts the reticle 20 on a reticle stage and performs positioning of the reticle 20 with the reticle stage.

Next, the semiconductor substrate 30 on which the photoresist film is provided is set in the exposure apparatus. The exposure apparatus mounts the semiconductor substrate 30 on a wafer stage.

Next, the exposure apparatus controls the wafer stage to expose the pattern provided in the reticle 20 on the semiconductor substrate 30 while moving the semiconductor substrate 30 in the X-direction and the Y-direction at a pitch corresponding to the length in the X-direction and the length in the Y-direction of the chip region 10.

Figure 6A:
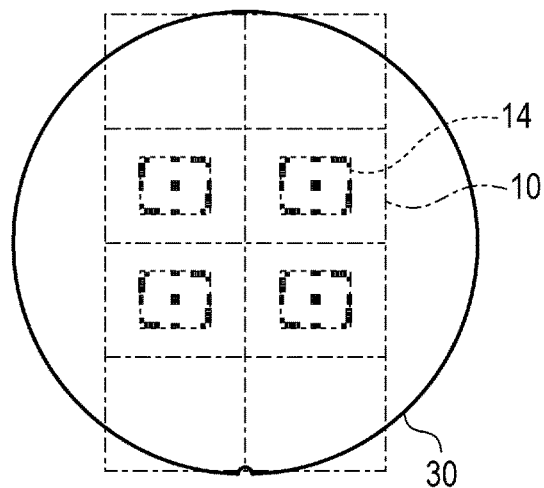
FIGS. 6A, 6B, 6C, 6D, 6E, and 6F are plan views illustrating a method of manufacturing a semiconductor device according to the third embodiment of the present invention.

For example, each of the regions partitioned by a one-dot-chain line in FIG. 6A corresponds to the chip region 10. Information on the arrangement of the chip regions 10 on the semiconductor substrate 30, such as coordinates of the chip region 10, the pitch or the number in the X-direction and the Y-direction, is input in advance to the exposure apparatus as arrangement reference information of the semiconductor device of interest. The exposure apparatus refers to this arrangement reference information and moves the semiconductor substrate 30 mounted on the wafer stage in the X-direction and the Y-direction at a predetermined pitch by a step-and-repeat scheme. Then, an illumination light passing through the reticle 20 is irradiated on the semiconductor substrate 30 for each motion, the pattern (the alignment patterns 22X and 22Y and the alignment accuracy measuring patterns 24) provided in the reticle 20 is projected in a reduced size onto the semiconductor substrate 30. Thereby, latent images corresponding to the alignment patterns 22X and 22Y and the alignment accuracy measuring patterns 24 are formed on the photoresist film of the semiconductor substrate 30.

In such a way, the patterns provided in the reticle 20 are exposed within each of the chip regions 10 of the semiconductor substrate 30 defined by the arrangement reference information, respectively. Each of the regions partitioned by a dotted line in FIG. 6A is the alignment mark arrangement region 14 on which the patterns provided in the reticle 20 are exposed.

Next, the semiconductor substrate 30 on which the patterns provided in the reticle 20 have been exposed is extracted from the exposure apparatus, and the exposed photoresist film is developed by using a developing fluid. Thereby, the alignment marks 16X and 16Y corresponding to the alignment patterns 22X and 22Y on the reticle 20 are formed within each of the chip regions 10 of the semiconductor substrate 30. Further, within each of the chip regions 10 of the semiconductor substrate 30, the alignment accuracy measuring marks 18 corresponding to the alignment accuracy measuring marks 24 on the reticle 20 are formed.

Next, the semiconductor substrate 30 is etched using the photoresist film as a mask in which the alignment marks 16X and 16Y and the alignment accuracy measuring marks 18 are formed. Thereby, the alignment marks 16X and 16Y and the alignment accuracy measuring marks 18 are transcribed on the semiconductor substrate 30. The photoresist film over the semiconductor substrate 30 is then removed by ashing or the like.

Figure 6B:
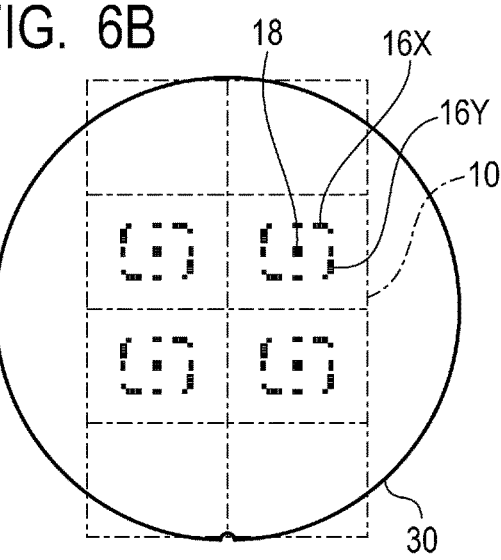

In such a way, the alignment marks 16X and 16Y and the alignment accuracy measuring marks 18 formed of a difference in level on the surface of the semiconductor substrate 30 are formed within each of the chip regions 10 of the semiconductor substrate 30 (FIG. 6B).

Next, four reticles each provided with a predetermined pattern to be exposed on the divided pattern regions 12A, 12B, 12C, and 12D are set in the exposure apparatus, respectively.

Next, a photoresist film is again formed over the semiconductor substrate 30 on which the alignment marks 16X and 16Y and the alignment accuracy measuring marks 18 are formed, which is set in the exposure apparatus. The exposure apparatus mounts the semiconductor substrate 30 on the wafer stage.

Next, the exposure apparatus mounts a reticle provided with a predetermined pattern to be exposed on the divided pattern region 12A on the reticle stage and performs positioning with respect to the reticle stage.

Next, the exposure apparatus measures the alignment marks 16X and 16Y for several shots formed on the semiconductor substrate 30 and examines alignment information indicating coordinate positions of the alignment marks 16X and 16Y on the semiconductor substrate 30. The components of a shift in the X-direction and Y-direction, a rotational shift, a magnification error, or the like of the alignment mark arrangement region 14 are then calculated from the examined alignment information. Furthermore, the original arrangement reference information is corrected taking these components into consideration.

Figure 6C:
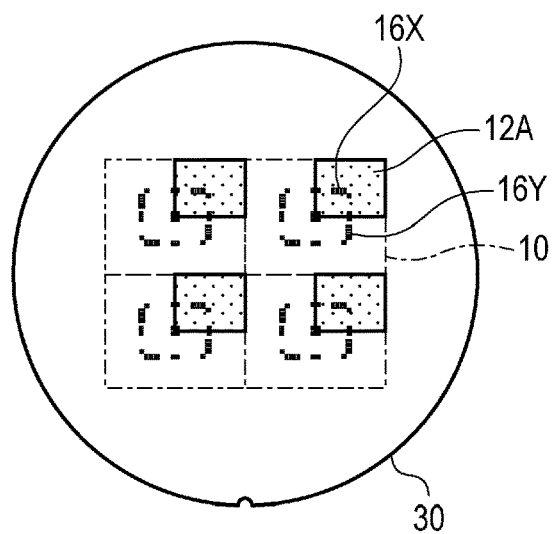

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12A. Thereby, a latent image of the pattern exposed on the divided pattern region 12A is formed on the photoresist film of the semiconductor substrate 30 (FIG. 6C).

Next, after extracting the reticle on the reticle stage, the exposure apparatus mounts a reticle provided with a predetermined pattern to be exposed on the divided pattern region 12B on the reticle stage and performs positioning with respect to the reticle stage.

Figure 6D:
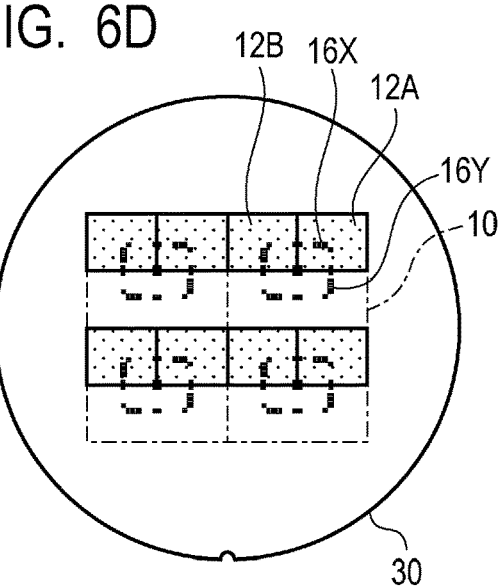

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12B. Thereby, a latent image of the pattern exposed on the divided pattern region 12B is formed on the photoresist film of the semiconductor substrate 30 (FIG. 6D).

Next, after extracting the reticle on the reticle stage, the exposure apparatus mounts a reticle provided with a predetermined pattern to be exposed on the divided pattern region 12C on the reticle stage and performs positioning with respect to the reticle stage.

Figure 6E:
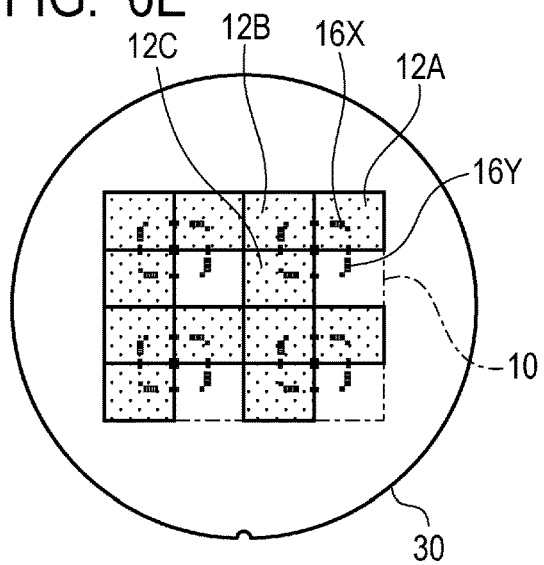

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12C. Thereby, a latent image of the pattern exposed on the divided pattern region 12C is formed on the photoresist film of the semiconductor substrate 30 (FIG. 6E).

Next, after extracting the reticle on the reticle stage, the exposure apparatus mounts a reticle provided with a predetermined pattern to be exposed on the divided pattern region 12D on the reticle stage and performs positioning with respect to the reticle stage.

Figure 6F:
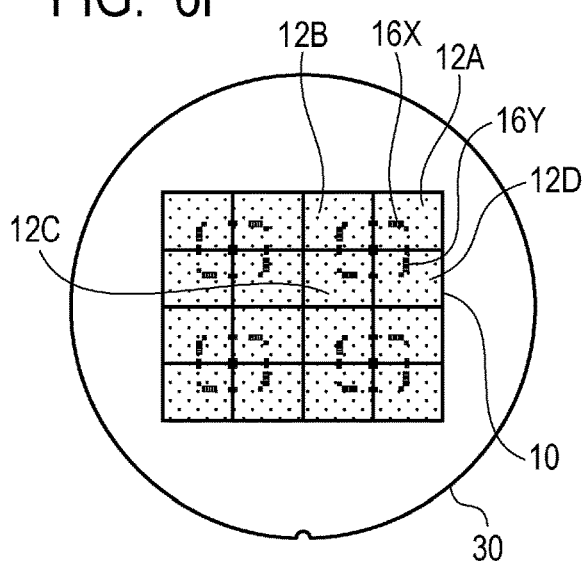

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12D. Thereby, a latent image of the pattern exposed on the divided pattern region 12D is formed on the photoresist film of the semiconductor substrate 30 (FIG. 6F).

Next, the semiconductor substrate 30 on which the exposure of the patterns on the divided pattern regions 12A, 12B, 12C, and 12D is completed is extracted from the exposure apparatus, and the exposed photoresist film is developed by using a developing fluid. Thereby, a photoresist film having a predetermined pattern is formed within each of the chip regions 10 of the semiconductor substrate 30.

Next, the alignment accuracy of the pattern of the photoresist film formed in the divided pattern regions 12A, 12B, 12C, and 12D is measured by using an alignment accuracy measuring instrument. In measurement of alignment accuracy, the arrangement of the resist pattern to the alignment accuracy measuring marks 18 arranged in the divided pattern regions 12A, 12B, 12C, and 12D, respectively, is measured. Measurement parameters include a shift component in the X-direction, a shift component in the Y-direction, a rotational component, and/or a magnification component.

When these measured parameters are within a desired range, it is determined that the positioning accuracy is good, and the process proceeds to the next step. When the measured parameters are out of a desired range, it is determined that the positioning accuracy is not good, an ashing process, a stripping solution, or the like is used to remove the photoresist film, and then formation of the photoresist film and exposure onto the divided pattern regions 12A, 12B, 12C, and 12D are again performed. At this time, the arrangement reference information may be corrected based on the parameters measured by the alignment accuracy measuring instrument if necessary.

Next, the patterned photoresist film is used to perform a predetermined process on the semiconductor substrate 30. For example, the semiconductor substrate 30 or the film provided thereon is etched using the photoresist film as a mask, the pattern of the photoresist film is transcribed on the semiconductor substrate 30 or the film provided thereon. Alternatively, ion implantation is performed using the photoresist film as a mask to add an impurity to a predetermined region of the semiconductor substrate 30. Then, the photoresist film on the semiconductor substrate 30 is removed by ashing or the like.

As discussed above, in the method of manufacturing the semiconductor device according to the present embodiment, the same alignment mark is used to perform exposure on the plurality of divided pattern regions 12A to 12D forming the chip region 10. Therefore, according to the present embodiment, the accuracy in connecting together the divided pattern region 12A to 12D can be improved.

Fourth Embodiment

A method of manufacturing a semiconductor device according to a fourth embodiment of the present invention will be described with reference to FIG. 7A to FIG. 9F. The same components as those in the semiconductor devices and the methods of manufacturing the same according to the first to third embodiments are labeled with the same reference numerals, and the description thereof will be omitted or simplified. FIG. 7A to FIG. 7D are diagrams illustrating a general configuration of a semiconductor device according to the present embodiment. FIG. 8A to FIG. 9F are plan views illustrating a method of manufacturing a semiconductor device according to the present embodiment.

Figure 7A:
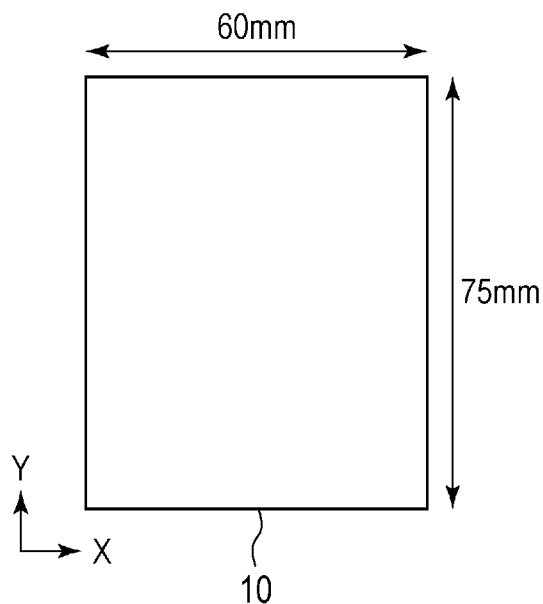
FIGS. 7A, 7B, 7C, and 7D are diagrams illustrating a general configuration of a semiconductor device according to a fourth embodiment of the present invention.

FIG. 7A illustrates the chip region 10 of the semiconductor device according to the present embodiment. In the present embodiment, the chip region 10 having a length in the X-direction of 60 mm and a length in the Y-direction of 75 mm is assumed. In the same manner as the first embodiment, when a case where the length in the X-direction of the effective exposure region of the exposure apparatus is 26 mm and the length in the Y-direction is 33 mm is assumed, the size in the X-direction of the chip region 10 of the semiconductor device according to the present embodiment is larger than the size of the effective exposure region of this exposure apparatus. Further, the size in the Y-direction of the chip region 10 is larger than twice the size of the effective exposure region of this exposure apparatus.

Figure 7B:
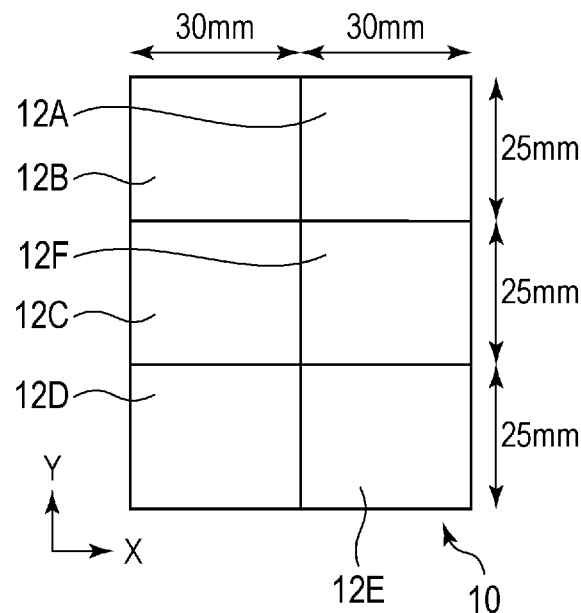

Accordingly, in the present embodiment, as illustrated in FIG. 7B for example, the chip region 10 is divided into two in the X-direction and divided into three in the Y-direction, and thus six divided pattern regions 12A, 12B, 12C, 12D, 12E, and 12F are defined. When the divided pattern regions 12 A, 12B, 12C, 12D, 12E, and 12F have an equal size, each size is 30 mm in the length in the X-direction and 25 mm in the length in the Y-direction. Note that the divided pattern regions 12 are not necessarily required to have the same size.

As discussed above, by appropriately setting the number of the divided pattern regions 12 in accordance with the relationship between the size of the chip region 10 of the semiconductor device and the size of the effective exposure region of the exposure apparatus, a larger sized pattern of the semiconductor device can be exposed on the semiconductor substrate.

Also in the method of manufacturing the semiconductor device according to the present embodiment, prior to exposure of patterns on the divided pattern regions 12A to 12F, an alignment mark used for positioning in the exposure of these patterns is formed on the semiconductor substrate. The formation of the alignment mark is performed through lithography using a reticle which is different from the reticle used for exposing the divided pattern regions 12A to 12F.

Figure 7C:
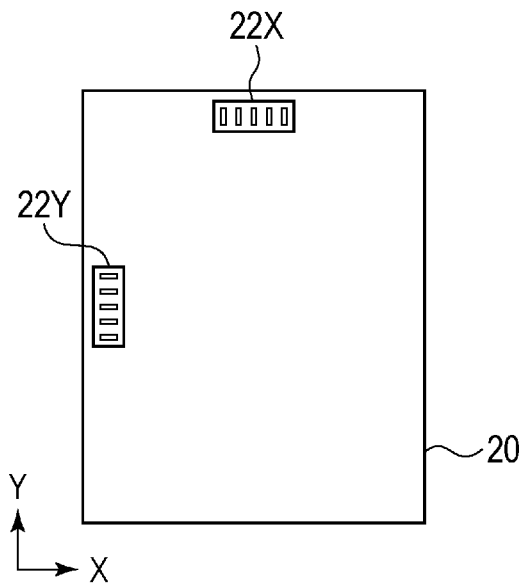

FIG. 7C is a schematic diagram of the reticle 20 used for lithography in forming an alignment mark on the semiconductor substrate. The reticle 20 includes the alignment patterns 22X used in X-direction alignment and the alignment patterns 22Y used in Y-direction alignment as illustrated in FIG. 7C. At least one set of the alignment patterns 22X and 22Y are provided in the reticle 20.

Figure 7D:
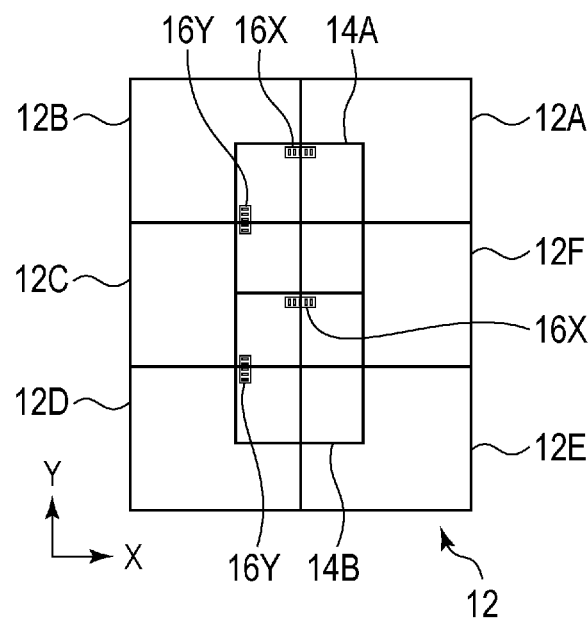

FIG. 7D is a diagram illustrating a relationship among the divided pattern regions 12A to 12F and a region (the alignment mark arrangement region 14) in which a pattern is arranged on the semiconductor substrate by lithography using the reticle 20. Within the alignment mark arrangement region 14, the alignment marks 16X and 16Y based on the alignment patterns 22X and 22Y on the reticle 20 are arranged.

As in the case of the semiconductor device according to the present embodiment, when the number of divided pattern regions 12 defined within the chip region 10 is relatively large, some divided pattern regions 12 may be arranged distant from the alignment mark arrangement region 14. An increase in the distance between the alignment marks 16X and 16Y and the divided pattern region 12 may cause a reduction in the positioning accuracy of the divided pattern region 12 of interest.

Accordingly, in such a case, it is desirable to arrange a plurality of alignment mark arrangement regions 14 within a single chip region 10 to suppress occurrence of the divided pattern region 12 having a large distance from the alignment marks 16X and 16Y. In the example of FIG. 7D, two alignment mark arrangement regions 14A and 14B are provided to six divided pattern regions 12A to 12F. Then, each of the divided pattern regions 12A to 12F has a region overlapping with at least any of the alignment mark arrangement regions 14A and 14B. Such a configuration allows for a shorter distance from each of the alignment marks 16X and 16Y to each of the divided pattern regions 12A to 12F, and this can improve the positioning accuracy.

Next, the method of manufacturing the semiconductor device according to the present embodiment will be more specifically described by using FIG. 8A to FIG. 9F. Here, the method of manufacturing the semiconductor device according to the present embodiment will be described with an example of a case of performing an initial exposure step in the manufacturing of the semiconductor device and an etching step as a subsequent step.

First, the reticle 20 in which the alignment patterns 22X and 22Y are provided is prepared. Further, reticles provided with predetermined patterns to be exposed on the divided pattern regions 12A to 12F are prepared, respectively.

Next, a photoresist material is spin-coated over a semiconductor substrate to be processed, prebake is performed thereon, and thereby a semiconductor substrate 30 provided with a photoresist film over the surface is prepared.

Next, the reticle 20 in which the alignment patterns 22X and 22Y are provided is set in the exposure apparatus. The exposure apparatus mounts the reticle 20 on a reticle stage and performs positioning of the reticle 20 with the reticle stage.

Next, the semiconductor substrate 30 on which the photoresist film is provided is set in the exposure apparatus. The exposure apparatus mounts the semiconductor substrate 30 on a wafer stage.

Next, the exposure apparatus controls the wafer stage to expose the pattern provided in the reticle 20 on the semiconductor substrate 30 while moving the semiconductor substrate 30 in the X-direction and the Y-direction at a pitch corresponding to the length in the X-direction and the length in the Y-direction of the chip region 10.

Figure 8A:
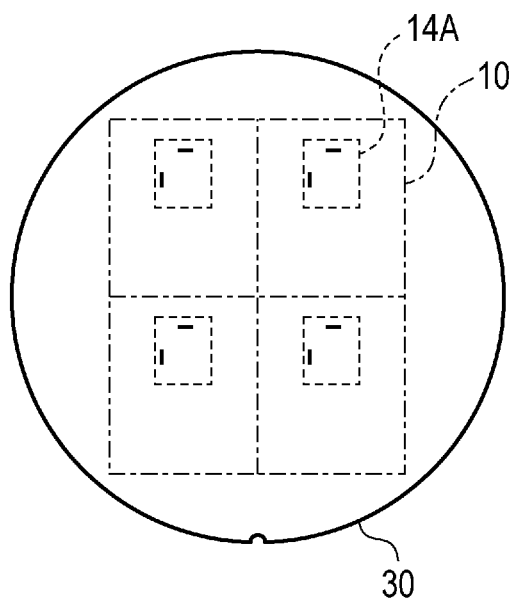

For example, each of the regions partitioned by a one-dot-chain line in FIG. 8A corresponds to the chip region 10. Information on the arrangement of the chip regions 10 on the semiconductor substrate 30, such as coordinates of the chip region 10, the pitch or the number in the X-direction and the Y-direction, is input in advance to the exposure apparatus as arrangement reference information of the semiconductor device of interest. The exposure apparatus refers to this arrangement reference information and moves the semiconductor substrate 30 mounted on the wafer stage in the X-direction and the Y-direction at a predetermined pitch by a step-and-repeat scheme. Then, an illumination light passing through the reticle 20 is irradiated on the semiconductor substrate 30 for each motion, and the pattern (the alignment patterns 22X and 22Y) provided in the reticle 20 is projected in a reduced size onto the semiconductor substrate 30. Thereby, latent images corresponding to the alignment patterns 22X and 22Y are formed in the photoresist film of the semiconductor substrate 30.

In such a way, the patterns provided in the reticle 20 are exposed within each of the chip regions 10 of the semiconductor substrate 30 defined by the arrangement reference information, respectively. Each of the regions partitioned by a dotted line in FIG. 8A is the alignment mark arrangement region 14 on which the patterns provided in the reticle 20 are exposed.

Figure 8B:
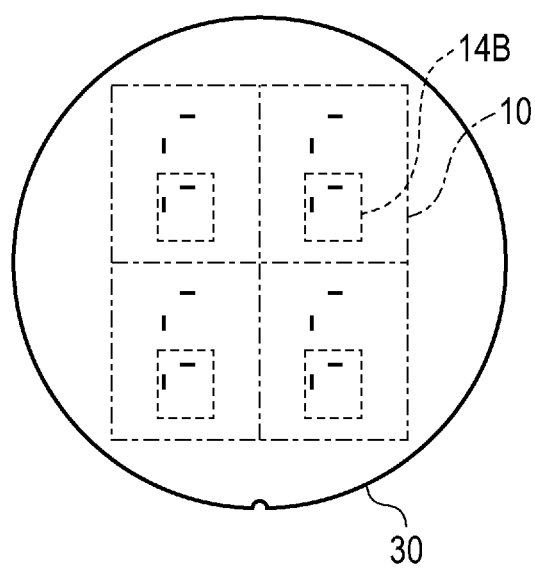

Next, in the same manner as the exposure on the alignment mark arrangement region 14A, patterns provided in the reticle 20 are exposed on regions different from the alignment mark arrangement region 14A within each of the chip regions 10, respectively. Each of the regions partitioned by a dotted line in FIG. 8B is the alignment mark arrangement region 14B on which the patterns provided in the reticle 20 are exposed.

Next, the semiconductor substrate 30 on which the patterns provided in the reticle 20 have been exposed is extracted from the exposure apparatus, and the exposed photoresist film is developed by using a developing fluid. Thereby, the alignment marks 16X and 16Y corresponding to the alignment patterns 22X and 22Y on the reticle 20 are formed within each of the chip regions 10 of the semiconductor substrate 30.

Next, the semiconductor substrate 30 is etched using the photoresist film as a mask in which the alignment marks 16X and 16Y are formed, and the alignment marks 16X and 16Y are transcribed on the semiconductor substrate 30. The photoresist film over the semiconductor substrate 30 is then removed by ashing or the like.

Figure 8C:
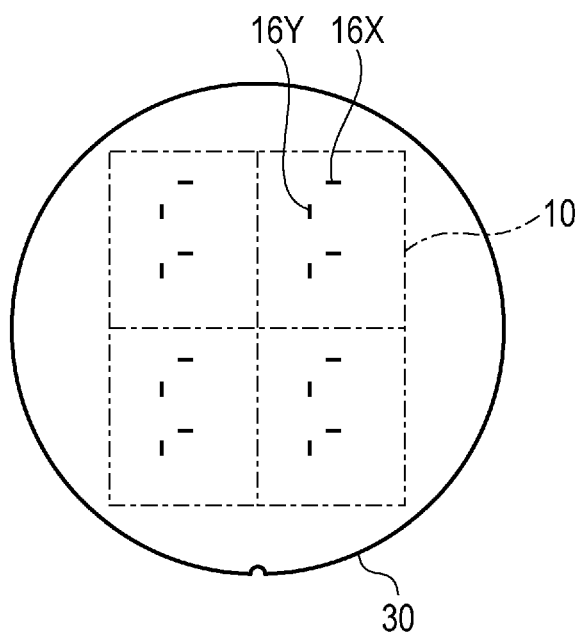

In such a way, the alignment marks 16X and 16Y formed of a difference in level on the surface of the semiconductor substrate 30 are formed within each of the chip regions 10 of the semiconductor substrate 30 (FIG. 8C).

Next, six reticles each provided with a predetermined pattern to be exposed on the divided pattern regions 12A to 12F are set in the exposure apparatus.

Next, a photoresist film is again formed over the semiconductor substrate 30 on which the alignment marks 16X and 16Y are formed, which is set in the exposure apparatus. The exposure apparatus mounts the semiconductor substrate 30 on the wafer stage.

Next, the exposure apparatus mounts a reticle provided with a predetermined pattern to be exposed on the divided pattern region 12A on the reticle stage and performs positioning with respect to the reticle stage.

Next, the exposure apparatus measures the alignment marks 16X and 16Y for several shots formed on the semiconductor substrate 30 and examines alignment information indicating coordinate positions of the alignment marks 16X and 16Y on the semiconductor substrate 30. The components of a shift in the X-direction and the Y-direction, a rotational shift, a magnification error, or the like of the alignment mark arrangement regions 14A and 14B are then calculated from the examined alignment information. Furthermore, the original arrangement reference information is corrected taking these components into consideration.

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12A. Thereby, a latent image of the pattern exposed on the divided pattern region 12A is formed on the photoresist film of the semiconductor substrate 30 (FIG. 9A).

Next, after extracting the reticle on the reticle stage, the exposure apparatus mounts a reticle provided with a predetermined pattern to be exposed on the divided pattern region 12B on the reticle stage and performs positioning with respect to the reticle stage.

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12B. Thereby, a latent image of the pattern exposed on the divided pattern region 12B is formed on the photoresist film of the semiconductor substrate 30 (FIG. 9B).

Next, after extracting the reticle on the reticle stage, the exposure apparatus mounts a reticle provided with a predetermined pattern to be exposed on the divided pattern region 12C on the reticle stage and performs positioning with respect to the reticle stage.

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12C. Thereby, a latent image of the pattern exposed on the divided pattern region 12C is formed on the photoresist film of the semiconductor substrate 30 (FIG. 9C).

Next, after extracting the reticle on the reticle stage, the exposure apparatus mounts a reticle provided with a predetermined pattern to be exposed on the divided pattern region 12D on the reticle stage and performs positioning with respect to the reticle stage.

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12D. Thereby, a latent image of the pattern exposed on the divided pattern region 12D is formed on the photoresist film of the semiconductor substrate 30 (FIG. 9D).

Next, after extracting the reticle on the reticle stage, the exposure apparatus mounts a reticle provided with a predetermined pattern to be exposed on the divided pattern region 12E on the reticle stage and performs positioning with respect to the reticle stage.

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12E. Thereby, a latent image of the pattern exposed on the divided pattern region 12E is formed on the photoresist film of the semiconductor substrate 30 (FIG. 9E).

Next, after extracting the reticle on the reticle stage, the exposure apparatus mounts a reticle provided with a predetermined pattern to be exposed on the divided pattern region 12F on the reticle stage and performs positioning with respect to the reticle stage.

Next, the exposure apparatus refers to the corrected arrangement reference information and moves the semiconductor substrate 30 mounted on the wafer stage in the X-direction and the Y-direction at a predetermined pitch by a step-and-repeat scheme. Then, for each motion, after the alignment marks 16X and 16Y of the corresponding chip region 10 are detected to perform positioning of the semiconductor substrate 30, the pattern on the reticle is projected in a reduced size onto the divided pattern region 12F. Thereby, a latent image of the pattern exposed on the divided pattern region 12F is formed on the photoresist film of the semiconductor substrate 30 (FIG. 9F).

Next, the semiconductor substrate 30 on which the exposure of the patterns on the divided pattern regions 12A to 12F is completed is extracted from the exposure apparatus, and the exposed photoresist film is developed by using a developing fluid. Thereby, a photoresist film having a predetermined pattern is formed within each of the chip regions 10 of the semiconductor substrate 30.

Next, the patterned photoresist film is used to perform a predetermined process on the semiconductor substrate 30. For example, the semiconductor substrate 30 or the film provided thereon is etched using the photoresist film as a mask, and the pattern of the photoresist film is transcribed on the semiconductor substrate 30 or the film provided thereon. Alternatively, ion implantation is performed using the photoresist film as a mask to add an impurity to a predetermined region of the semiconductor substrate 30. Then, the photoresist film on the semiconductor substrate 30 is removed by ashing or the like.

As discussed above, in the method of manufacturing the semiconductor device according to the present embodiment, the same alignment mark is used to perform exposure on the plurality of divided pattern regions 12A to 12F forming the chip region 10. Therefore, according to the present embodiment, the accuracy in connecting together the divided pattern region 12A to 12F can be improved.

Modified Embodiments

The present invention is not limited to the above-described embodiments, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, the number or arrangement of the divided pattern regions 12 arranged in the chip region 10 can be changed as appropriate in accordance with the size or the shape of the chip region 10.

Further, while the case where the chip region of a semiconductor device is larger than the effective exposure region of an exposure apparatus is assumed in the embodiments described above, the present invention may be applied to a case where the chip region of a semiconductor device is smaller than the effective exposure region of an exposure apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-157583, filed Aug. 17, 2017, which is hereby incorporated by reference herein in its entirety.

What is claimed is:

1. A method of manufacturing a semiconductor device comprising:
    forming a first photoresist film over a substrate;
    exposing a first pattern including an alignment pattern on the first photoresist film in a first region on the substrate;
    forming, on the substrate, an alignment mark corresponding to the alignment pattern of the first pattern exposed on the first photoresist film;
    forming a second photoresist film over the substrate on which the alignment mark is formed;
    exposing a second pattern divided into a plurality of pattern regions on the second photoresist film in a second region on the substrate, the plurality of pattern regions being separately exposed while performing positioning with respect to the alignment mark; and
    developing the second photoresist film and forming the second photoresist film having the second pattern,
    wherein at least a part of the second region is located outside an effective exposure region of an exposure apparatus in exposure of the first pattern.

2. The method of manufacturing a semiconductor device according to claim 1, wherein each of the plurality of pattern regions of the second pattern at least partially overlaps with the first region.

3. The method of manufacturing a semiconductor device according to claim 1, wherein the first region is arranged inside a circumference of the second region.

4. The method of manufacturing a semiconductor device according to claim 2, wherein the first region is arranged inside a circumference of the second region.

5. The method of manufacturing a semiconductor device according to claim 3, wherein a plurality of the first regions are arranged inside the circumference of the second region.

6. The method of manufacturing a semiconductor device according to claim 4, wherein a plurality of the first regions are arranged inside the circumference of the second region.

7. The method of manufacturing a semiconductor device according to claim 1,
    wherein the second region is larger than an effective exposure region of an exposure apparatus that exposes the second pattern, and
    wherein each of the plurality of pattern regions is smaller than the effective exposure region of the exposure apparatus that exposes the second pattern.

8. The method of manufacturing a semiconductor device according to claim 1, wherein the second region is a chip region of a semiconductor device.

9. The method of manufacturing a semiconductor device according to claim 1, wherein at least one alignment mark is arranged in each region corresponding to each of the plurality of pattern regions of the second pattern of the substrate.

10. The method of manufacturing a semiconductor device according to claim 1, wherein the first pattern further includes an alignment accuracy measuring pattern.

11. The method of manufacturing a semiconductor device according to claim 1, wherein the plurality of pattern regions are arranged two-dimensionally in the second region.

12. The method of manufacturing a semiconductor device according to claim 1,
    wherein each of the plurality of pattern regions has an overlapping region between neighboring regions, and
    wherein the alignment mark is arranged in a region other than the overlapping region.

13. The method of manufacturing a semiconductor device according to claim 1, wherein the forming the alignment mark includes developing the exposed first photoresist film and forming the alignment mark formed from the first photoresist film.

14. The method of manufacturing a semiconductor device according to claim 13, wherein the forming the alignment mark further includes etching the substrate using the first photoresist film as a mask and transcribing the alignment mark onto the substrate.

* * * * *